(12) United States Patent
Wang et al.

(10) Patent No.: US 11,733,309 B2
(45) Date of Patent: Aug. 22, 2023

(54) METHOD AND SYSTEM FOR SELF-DISCHARGE PROGNOSTICS FOR VEHICLE BATTERY CELLS WITH AN INTERNAL SHORT CIRCUIT

(71) Applicant: GM GLOBAL TECHNOLOGY OPERATIONS LLC, Detroit, MI (US)

(72) Inventors: Yue-Yun Wang, Troy, MI (US); Yangbing Zeng, Troy, MI (US); Taylor R. Garrick, Royal Oak, MI (US); Andrew C. Baughman, Northville, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 0 days.

(21) Appl. No.: 17/405,488

(22) Filed: Aug. 18, 2021

(65) Prior Publication Data

US 2023/0055095 A1 Feb. 23, 2023

(51) Int. Cl.
*G01R 31/3835* (2019.01)
*G01R 31/396* (2019.01)
*G01R 31/388* (2019.01)

(52) U.S. Cl.
CPC ....... *G01R 31/3835* (2019.01); *G01R 31/388* (2019.01); *G01R 31/396* (2019.01)

(58) Field of Classification Search
CPC . G01R 31/3835; G01R 31/388; G01R 31/396
See application file for complete search history.

(56) References Cited

U.S. PATENT DOCUMENTS

| | | | |
|---|---|---|---|
| 10,594,145 B1* | 3/2020 | Wang | G01R 31/392 |
| 2010/0194398 A1* | 8/2010 | Kawasumi | H01M 10/42 |
| | | | 324/430 |
| 2015/0212162 A1* | 7/2015 | Nakayama | G01R 31/385 |
| | | | 324/426 |
| 2017/0054311 A1* | 2/2017 | Masias | H02J 7/0031 |
| 2019/0033380 A1* | 1/2019 | Kim | H01M 10/0525 |
| 2019/0326650 A1* | 10/2019 | McCoy | G01R 31/388 |
| 2020/0110134 A1* | 4/2020 | Li | G01R 31/374 |
| 2021/0257681 A1* | 8/2021 | Takahashi | H01M 10/48 |
| 2021/0359347 A1* | 11/2021 | Stefanopoulou | H01M 10/0525 |

FOREIGN PATENT DOCUMENTS

| | | | | |
|---|---|---|---|---|
| CN | 111999656 A | * | 11/2020 | ........... G01R 31/367 |
| EP | 3537531 B1 | * | 8/2021 | ............. G01R 31/36 |
| JP | 2009296699 A | * | 12/2009 | |

* cited by examiner

*Primary Examiner* — Robert H Kim
*Assistant Examiner* — Christopher J Gassen
(74) *Attorney, Agent, or Firm* — Quinn IP Law

(57) ABSTRACT

A system for self-discharge prognostics for vehicle battery cells with an internal short circuit includes a plurality of battery cells and a voltage sensor providing open-circuit voltage data over time for each battery cell. The system further includes a computerized prognostic controller operating programming to monitor the open-circuit voltage data over time for each of the plurality of battery cells and evaluate a voltage drop rate through a time window for each of the plurality of battery cells based upon the open-circuit voltage data. The controller further identifies one of the plurality of battery cells to include the internal short circuit based upon the voltage drop rate and signals an alert based upon the one of the plurality of battery cells including the internal short circuit.

9 Claims, 7 Drawing Sheets

METHOD AND SYSTEM FOR SELF-DISCHARGE PROGNOSTICS FOR VEHICLE BATTERY CELLS WITH AN INTERNAL SHORT CIRCUIT

INTRODUCTION

The disclosure generally relates to a method and system for self-discharge prognostics for vehicle battery cells with an internal short circuit.

Battery cells may include an anode, a cathode, a separator or membrane, and an electrolyte. A battery cell may operate in charge mode, receiving electrical energy. A battery cell may operate in discharge mode, providing electrical energy. A battery cell may operate through charge and discharge cycles, where the battery first receives and stores electrical energy and then provides electrical energy to a connected system. In vehicles utilizing electrical energy to provide motive force, battery cells of the vehicle may be charged, and then the vehicle may navigate for a period of time, utilizing the stored electrical energy to generate motive force.

A battery cell in functional operation provides electrical energy through a pair of external terminals. Over time and through charge and discharge cycles, operation and structure of the battery cell may deteriorate. In one example, a separator or membrane may be perforated or broken. In such an occurrence, an internal short circuit within the battery cell may be created where current flows within the battery cell despite the terminals being unconnected or being in an open circuit condition. Such an internal short circuit may cause undesirable heat to be generated and may prevent operation of the vehicle.

SUMMARY

A system for self-discharge prognostics for vehicle battery cells of a vehicle with an internal short circuit is provided. The system includes a battery pack including a plurality of battery cells and, for each of the plurality of battery cells, a voltage sensor providing open-circuit voltage data over time. The system further includes a computerized prognostic controller, operating programming to monitor the open-circuit voltage data over time for each of the plurality of battery cells and evaluate a voltage drop rate through a time window for each of the plurality of battery cells based upon the open-circuit voltage data. The computerized prognostic controller further operates programming to identify one of the plurality of battery cells to include the internal short circuit based upon the voltage drop rate and signal an alert based upon the one of the plurality of battery cells including the internal short circuit.

In some embodiments, evaluating the voltage drop rate for each of the battery cells includes iteratively applying linear regression at progressively extended time window length to estimate a line describing voltage drop per unit time for each of the plurality of battery cells. Identifying the one of the plurality of battery cells to include the internal short circuit includes analyzing a slope of the line describing voltage drop per unit time for each of the plurality of battery cells.

In some embodiments, analyzing the slope of the line describing voltage drop per unit time includes comparing the slope of the line describing voltage drop per unit time for a first of the plurality of battery cells to slopes of the line describing voltage drop per unit time for a rest of the plurality of battery cells.

In some embodiments, analyzing the slope of the line describing voltage drop per unit time includes comparing the slope of the line describing voltage drop per unit time for each of the plurality of battery cells to a threshold slope value.

In some embodiments, evaluating the voltage drop rate for each of the battery cells includes iteratively applying a recursive least square algorithm to estimate a line slope parameter describing voltage drop per unit time over a progressively extended time window for each of the plurality of battery cells. Identifying the one of the plurality of battery cells to include the internal short circuit includes analyzing the line slope parameter describing voltage drop per unit time for each of the plurality of battery cells.

In some embodiments, evaluating the voltage drop rate for each of the battery cells includes applying a Kalman filter to estimate slope and intercept parameters of a line describing voltage drop per unit time for each of the plurality of battery cells. Identifying the one of the plurality of battery cells to include the internal short circuit includes analyzing the slope and intercept parameters of the line describing voltage drop per unit time for each of the plurality of battery cells.

In some embodiments, evaluating the voltage drop rate for each of the battery cells includes applying a Kalman filter to estimate an internal short resistance for each of the plurality of battery cells. Identifying the one of the plurality of battery cells to include the internal short circuit includes analyzing the internal short resistance for each of the plurality of battery cells.

In some embodiments, signaling the alert includes providing a warning to an operator of the vehicle.

In some embodiments, signaling the alert includes providing a warning to a remote server device through a wireless communications network.

According to one alternative embodiment, a system for self-discharge prognostics for vehicle battery cells of a vehicle with an internal short circuit is provided. The system includes a battery pack including a plurality of battery cells and, for each of the plurality of battery cells, a voltage sensor providing open-circuit voltage data over time. The system further includes a computerized prognostic controller operating programming to monitor the open-circuit voltage data over time for each of the plurality of battery cells and iteratively evaluate a voltage drop rate through a plurality of progressively longer time windows for each of the plurality of battery cells based upon the open-circuit voltage data. The computerized prognostic controller further operates programming to identify one of the plurality of battery cells to include the internal short circuit based upon the voltage drop rate and signal an alert based upon the one of the plurality of battery cells including the internal short circuit.

In some embodiments, iteratively evaluating the voltage drop rate through the plurality of progressively longer time windows for each of the battery cells includes iteratively applying linear regression to estimate a line describing voltage drop per unit time for each of the plurality of battery cells. Identifying the one of the plurality of battery cells to include the internal short circuit includes analyzing a slope of the line describing voltage drop per unit time for each of the plurality of battery cells.

In some embodiments, analyzing the slope of the line describing voltage drop per unit time includes comparing the slope of the line describing voltage drop per unit time for a first of the plurality of battery cells to slopes of the line describing voltage drop per unit time for a rest of the plurality of battery cells.

In some embodiments, analyzing the slope of the line describing voltage drop per unit time includes comparing the slope of the line describing voltage drop per unit time for each of the plurality of battery cells to a threshold slope value.

In some embodiments, evaluating the voltage drop rate for each of the battery cells includes iteratively applying a recursive least square algorithm to estimate a line slope parameter describing voltage drop per unit time over a progressively extended time window for each of the plurality of battery cells. Identifying the one of the plurality of battery cells to include the internal short circuit includes analyzing the line slope parameter describing voltage drop per unit time for each of the plurality of battery cells.

In some embodiments, iteratively evaluating the voltage drop rate for each of the battery cells includes applying a Kalman filter to estimate slope and intercept parameters of a line describing voltage drop per unit time for each of the plurality of battery cells. Identifying the one of the plurality of battery cells to include the internal short circuit includes analyzing the slope and intercept parameters of the line describing voltage drop per unit time for each of the plurality of battery cells.

In some embodiments, iteratively evaluating the voltage drop rate for each of the battery cells includes applying a Kalman filter to estimate an internal short resistance for each of the plurality of battery cells. Identifying the one of the plurality of battery cells to include the internal short circuit includes analyzing the internal short resistance for each of the plurality of battery cells.

According to one alternative embodiment, a method for self-discharge prognostics for vehicle battery cells with an internal short circuit is provided. The method includes, for each of a plurality of battery cells within a battery pack, operating a voltage sensor providing open-circuit voltage data over time. The method further includes, within a computerized prognostic controller, monitoring the open-circuit voltage data over time for each of the plurality of battery cells and iteratively evaluating a voltage drop rate through a plurality of progressively longer time windows for each of the plurality of battery cells based upon the open-circuit voltage data. The method further includes, within the computerized prognostic controller, identifying one of the plurality of battery cells to include the internal short circuit based upon the voltage drop rate and signaling an alert based upon the one of the plurality of battery cells including the internal short circuit.

In some embodiments, iteratively evaluating the voltage drop rate through the plurality of progressively longer time windows for each of the battery cells includes iteratively applying linear regression to estimate a line describing voltage drop per unit time for each of the plurality of battery cells. Identifying the one of the plurality of battery cells to include the internal short circuit includes analyzing a slope of the line describing voltage drop per unit time for each of the plurality of battery cells.

In some embodiments, evaluating the voltage drop rate for each of the battery cells includes iteratively applying a recursive least square algorithm to estimate a line slope parameter describing voltage drop per unit time over a progressively extended time window for each of the plurality of battery cells. Identifying the one of the plurality of battery cells to include the internal short circuit includes analyzing the line slope parameter describing voltage drop per unit time for each of the plurality of battery cells.

In some embodiments, iteratively evaluating the voltage drop rate for each of the battery cells includes applying a Kalman filter to estimate slope and intercept parameters of a line describing voltage drop per unit time for each of the plurality of battery cells. Identifying the one of the plurality of battery cells to include the internal short circuit includes analyzing the slope and intercept parameters of the line describing voltage drop per unit time for each of the plurality of battery cells.

The above features and advantages and other features and advantages of the present disclosure are readily apparent from the following detailed description of the best modes for carrying out the disclosure when taken in connection with the accompanying drawings.

DETAILED DESCRIPTION

Figure 1:
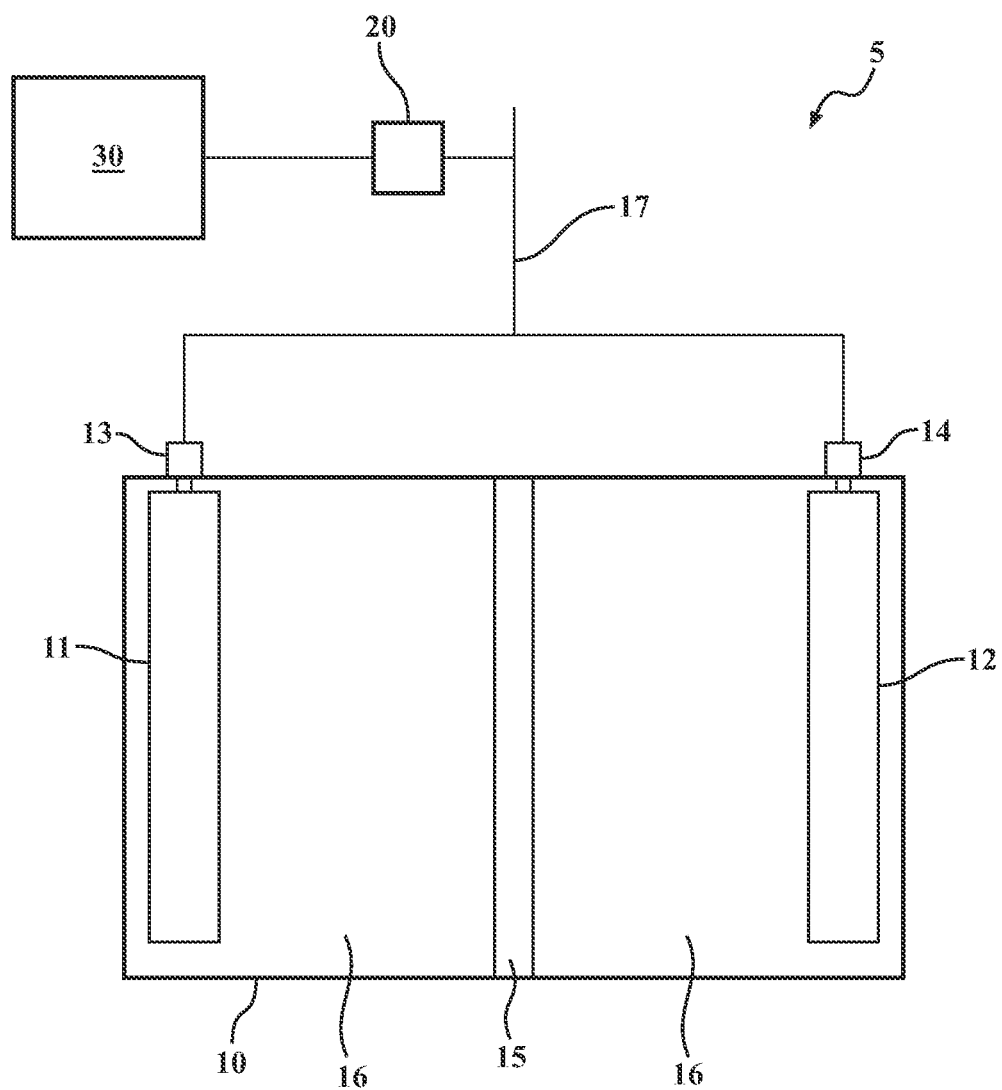
FIG. 1 schematically illustrates an exemplary system for self-discharge prognostics including a battery cell, a voltage sensor, and a computerized prognostics controller, in accordance with the present disclosure.

Electrical charge stored within a battery cell may be described as battery state of charge or state of charge (SOC). At a particular SOC, the battery cell delivers a predictable open-circuit voltage. When a battery cell is not in use, the SOC and the corresponding open-circuit voltage decline slowly, for example, discharging over a number of weeks. When a battery cell is in discharge mode, the SOC decreases over time based upon a number of amp-hours drawn from the battery. When measured in an open-circuit condition, the battery cell having operated in discharge mode and having depleted some measure of SOC, demonstrates a corresponding drop in open-cell voltage.

When a battery cell in an open circuit condition, with no closed circuit attached to the battery cell terminals, experiences an internal short circuit, a current flow is created within the battery cell. This current flow may be relatively small at first. As a result of this current flow within the battery cell, the SOC and the corresponding open-circuit voltage slowly declines. Such a slow drop in open-circuit voltage may be difficult to detect. A number of alternative analyses or prognostic algorithms may be used to prognose or determine that an internal short circuit is present in a battery cell. In one exemplary embodiment of a prognostic algorithm, a first or second order polynomial regression or a linear regression may be utilized to generate a polyfit line representing an open-circuit voltage change over time for each of a plurality of battery cells. If one of the polyfit lines includes a negative slope indicating significant open-circuit voltage drop in the corresponding battery cell than a normal self-discharge of the rest of healthy cells in a battery pack, that negative slope may be utilized to determine that the battery cell includes an internal short circuit.

Methods disclosed herein may evaluate or prognose a voltage drop over time. This time span or time window may be progressively altered. For example, a short time window may be examined to evaluate whether a gross or serious short circuit condition is developing. The same data may be iteratively examined under longer time windows to look for slower drops in voltage that still indicate that a short circuit condition is developing.

In one embodiment of utilizing a linear regression algorithm, a sequence of operations may include 1) define time values (e.g., 1, 2, 3, . . . 500 seconds), 2) calculate battery cell voltage or voltage residuals (Vrsd=[rsd(1), rsd(2), rsd (3), . . . rsd(500)], 3) use a first or second order polynomial regression to fit the following equation $$y_{rsd} = \text{polyfit}(t, \text{Vrsd}, 1) = v_1 t + v_0 \quad (1)$$

where $v_1$ describes the slope of the polyfit line or generated line and $v_0$ describes an intercept value for the polyfit line. A cell voltage residual may be defined as follows.

$$rsd_i = \text{Vcell}(i) - \text{Vmean}, i=1,2, \ldots 96 \quad (2)$$

A voltage residual is a comparison of the voltage of each battery cell to a mean or average voltage for the plurality of battery cells. The slope, $v_1$, and offset or intercept, $v_0$, may be then utilized to classify the corresponding battery cell as including an internal short circuit.

In the first embodiment, wherein a linear regression algorithm is utilized, evaluating the voltage drop rate through a time window for each of the battery cells may include iteratively applying linear regression at progressively extended time window length to estimate a line describing voltage drop per unit time for each of the plurality of battery cells. Identifying the one of the plurality of battery cells to include the internal short circuit includes analyzing a slope of the line describing voltage drop per unit time for each of the plurality of battery cells.

In a second exemplary embodiment of a prognostic algorithm, a recursive least square algorithm may be applied to open-circuit voltage data. A voltage drop model may be defined by the following equation.

$$V_{cell(i)} = at + b, \quad b = \frac{R_{sc}}{R_{sc} + R} V_{OC}(s(0)), \quad a = a(R_{sc}, Cap, V_t) \quad (3)$$

wherein $V_{cell(i)}$ may be defined a the ith cell terminal voltage or $V_{t(i)}$; i=1, 2, 3, . . . n. The value t describes time, a describes the voltage drop slope, and b describes terminal voltage at time t=0. Similarly, an SOC drop model may be defined by the following equation.

$$SOC_{(i)} = \alpha t + b, \quad b = s(0) \quad (4)$$

Recursive least square (RLS) estimation of $\alpha$ and b my be determined as follows, alternatively defined by either Equation 5 or 6.

$$y_k = V_{cell} = [\alpha b]*[t1]^T + \varepsilon(k) \quad (5)$$

$$y_k = SOC_{cell} = [\alpha b]*[t1]^T + \varepsilon(k) \quad (6)$$

$$\theta = [\alpha b], \varphi = [t\ 1]^T \quad (7)$$

wherein $\varepsilon(k)$ describes process noises. Utilizing this RLS algorithm, $\alpha$, the slope of the determined line and b, the intercept of the determined line, may be utilized to evaluate the corresponding open-circuit voltage data and the corresponding battery cell. The negative slope provided by the $\alpha$ value may be compared to the slope values of other similar data or to threshold a value, and a slope indicating a loss in open-circuit voltage and corresponding SOC may be utilized to determine that that battery cell includes an internal short circuit.

In the second embodiment, wherein the RLS algorithm is utilized, evaluating the voltage drop for each of the battery cells may include iteratively applying a recursive least square algorithm to estimate a line slope parameter describing voltage drop per unit time over a progressively extended time window for each of the plurality of battery cells. Identifying the one of the plurality of battery cells to include the internal short circuit includes analyzing a slope of the line describing voltage drop per unit time for each of the plurality of battery cells.

In a third exemplary embodiment of a prognostic algorithm, a Kalman filter may be utilized to estimate a voltage drop rate indicating a battery cell includes an internal short circuit. A voltage drop model may be expanded from Equation 3 to the Equations 8-10, as follows.

$$\alpha(k+1) = \alpha(k) + \varepsilon_1(k) \quad (8)$$

$$b(k+1) = b(k) + \varepsilon_2(k) \quad (9)$$

$$y(k) = V(t) = \alpha(k)t(k) + b(k) + v(k) \quad (10)$$

where the slope and intercept are defined as two states to be estimated by Kalman filter. k indicates sample time at time k. Since at vehicle rest, self-discharge current is very small for a normal cell and cell open-circuit voltage does not change, the parameters $\alpha$ and b are considered the same at sample time (k+1) and k, $\varepsilon_1(k)$ and $\varepsilon_2(k)$ are white noises. Equation 3 becomes the last equation in Equation 8, which is called observation of the battery cell model, where v(k) is the voltage measurement noise. A standard Kalman filter can be applied to estimate slope $\alpha$ and intercept b via the observation equation expressed by Equation 10. Throughout the disclosure, a normal cell or a cell with normal self-discharge refer to a battery cell without an internal short circuit or developing short circuit condition.

The estimated slopes and intercepts for a set of battery cells from Kalman filter are compared to each other, if one negative slope in one cell is significant negative or out of bounds of the rest cell slopes, this cell is identified to have abnormal self-discharge.

As an alternative or fourth embodiment, an internal short resistance may also be estimated directly using Kalman filter applied to the following alternative 3-state space battery cell model $$x(k+1) = x(k) + \varepsilon_1(k), \quad x(k) = \frac{1}{R_{sc}} \quad (11)$$

$$q(k+1) = q(k) + \varepsilon_2(k), \quad q(k) = cap0/cap \quad (12)$$

$$s(k+1) = s(k) - x(k)\frac{V_t(k)dt}{cap0}q + \frac{I_L dt}{cap0} + \varepsilon_3(k), \quad (13)$$

$$s(k) = f_{voc2soc}(V_t(k)) + v(k)$$

where the first state x(k) is defined as the inverse of Rsc, the possible internal short resistance in a cell, the second state q(k) is the normalized cell capacity, defined as the mean capacity of the normal cells cap0 divided by the capacity of the cell cap to be monitored. The third state is the state of charge s(k) of the cell. $V_t(k)$ is the terminal voltage of the cell. dt is sample rate. $I_L$ is the external charge current, which is zero at vehicle rest. $\varepsilon_1(k)$, $\varepsilon_2(k)$ $\varepsilon_3(k)$ are process noises. In Equation 13, the observation equation is s(k) =$f_{voc2soc}(V_t(k))$+v(k). Since the self-discharge current is small, the state of charge can be calculated from an electrochemical Voc-SOC curve using the measured terminal voltage Vt(k). With the formulation of the state space model expressed by Equations 11-13 and the observation s(k), a standard Kalman filter can be applied to estimate the state x(k), thus the internal short resistance Rsc=1/x(k).

For a normal health cell, its internal short resistance is in theory infinite. If the estimated Rsc for a particular cell is smaller than a predefined threshold value or much smaller than the similar estimated internal short resistances of the rest of the cells in the pack, this cell is detected having an abnormal internal short.

Internal short circuits cause a voltage drop in a battery cell. However, there are other sources of voltage drops that may be accounted for to improve accuracy of the disclosed algorithms. For example, cell balance when applied to minimize differences in SOCs across battery cells may additionally cause voltage drop to the cells being balanced, those would cause false alarms. Therefore, a voltage drop caused by cell balancing needs to be corrected when applying the above algorithms. Such accounting for cell balance may be determined by the following equations.

$$SOC_{b(i)} \approx f_{voc2soc}(V_b(i)) \quad (14)$$

$$SOC_{(i)} = SOC_{b(i)} + \text{balanced}Ah(i)/\text{capacity} \quad (15)$$

$$V(i) = f_{soc2voc}(SOC_{(i)}) \quad (16)$$

wherein Vb(i), is a cell terminal voltage during cell balancing, V(i) is the cell terminal voltage corrected by removing the drop part induced by cell balancing.

The disclosed features and aspects of the present disclosure may be utilized across many fields where electrical energy is stored and utilized. In particular, the features and aspects of the present disclosure may resolve issues particular to specific technical fields such as battery cell technology and/or electric vehicle (EV) technology, for example, with prognostic methods and systems disclosed herein assisting such specific technology fields to be more reliable, more robust, and improving customer satisfaction.

Referring now to the drawings, wherein like reference numbers refer to like features throughout the several views, FIG. 1 schematically illustrates an exemplary system for self-discharge prognostics 5 including a battery cell 10, a voltage sensor 20, and a computerized prognostics controller 30. The battery cell 10 includes an anode 11, a negative battery terminal 13, a cathode 12, a positive battery terminal 14, a separator 15, and electrolyte fluid 16. Electrical connections 17 provide a circuit to measure cell voltage by sensor 20. Multiple cells are connected in series and parallel to form a battery pack that provides electrical power to other electrical components within the vehicle.

The computerized prognostics controller 30 is a computerized device including a computerized processor, random-access memory (RAM), and durable storage memory such as a hard drive or flash memory. The computerized prognostics controller 30 is operable to execute programmed code or algorithms. The computerized programmed controller may include one physical device or may include functionality spanning a plurality of physical devices.

Figure 2:
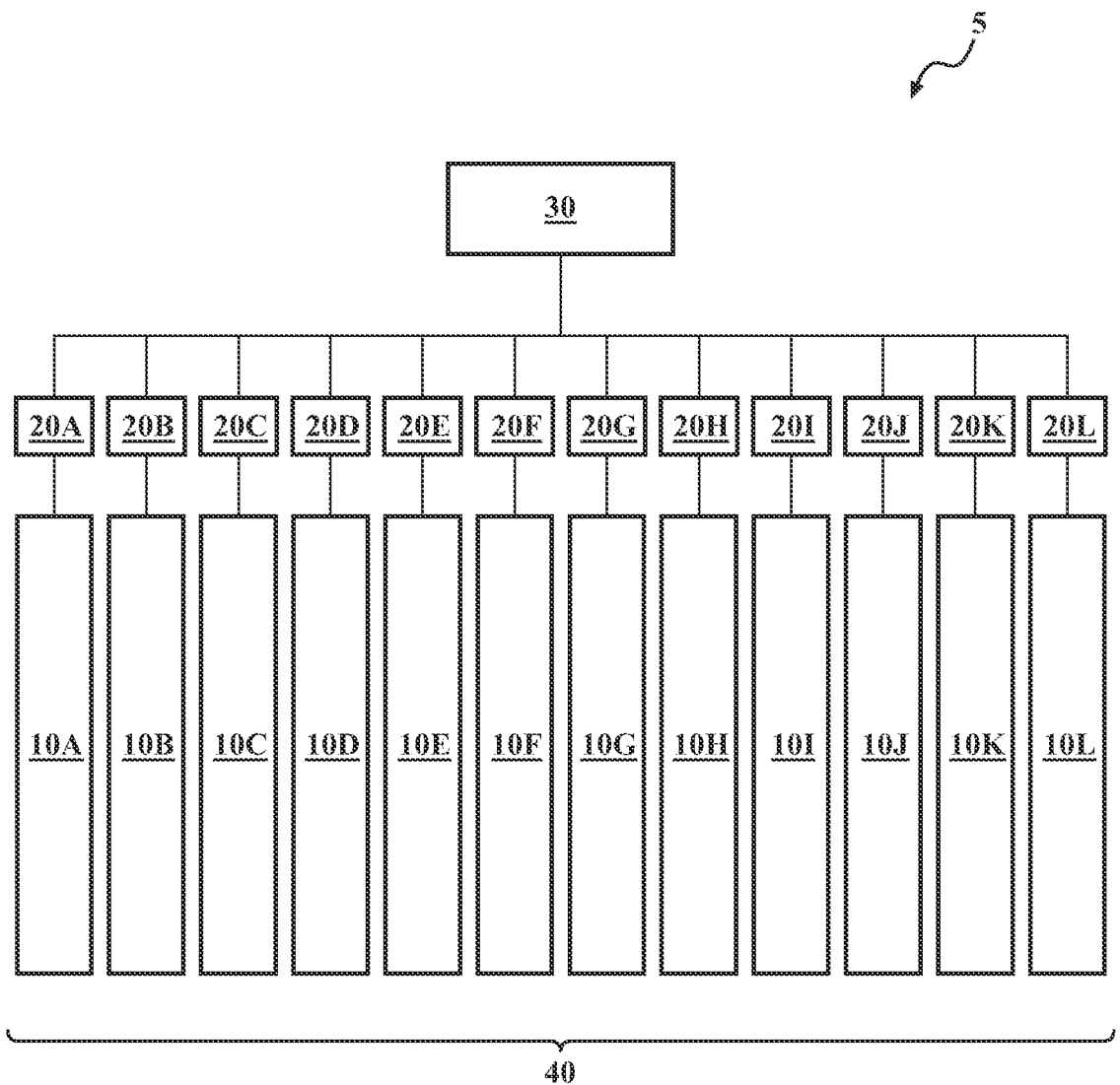
FIG. 2 schematically illustrates the system for self-discharge prognostics including a plurality of battery cells and a plurality of voltage sensors, in accordance with the present disclosure.

A battery pack may include a plurality of battery cells. A vehicle powered by a battery pack or a system including a plurality of battery packs may include a plurality of battery cells. FIG. 2 schematically illustrates the system for self-discharge prognostics 5 including a plurality of battery cells and a plurality of voltage sensors. A battery pack 40 is illustrated including twelve exemplary battery cells, battery cell 10A, battery cell 10B, battery cell 10C, battery cell 10D, battery cell 10E, battery cell 10F, battery cell 10G, battery cell 10H, battery cell 10I, battery cell 10J, battery cell 10K, and battery cell 10L. A plurality of voltage sensors are illustrated, including voltage sensor 20A, voltage sensor 20B, voltage sensor 20C, voltage sensor 20D, voltage sensor 20E, voltage sensor 20F, voltage sensor 20G, voltage sensor 20H, voltage sensor 20I, voltage sensor 20J, voltage sensor 20K, and voltage sensor 20L. Each voltage sensor is operable to monitor an open-circuit voltage for a respective battery cell when the battery cell is in an open-circuit condition, meaning that the battery cells are not operating in either a charge mode or a discharge mode. The computerized prognostics controller 30 is illustrated in electronic communication with the voltage sensors. By being operable to monitor open-circuit voltages for each of the battery cells, the computerized prognostics controller 30 may utilize this data and make determinations regarding each of the battery cells individually.

Figure 3:
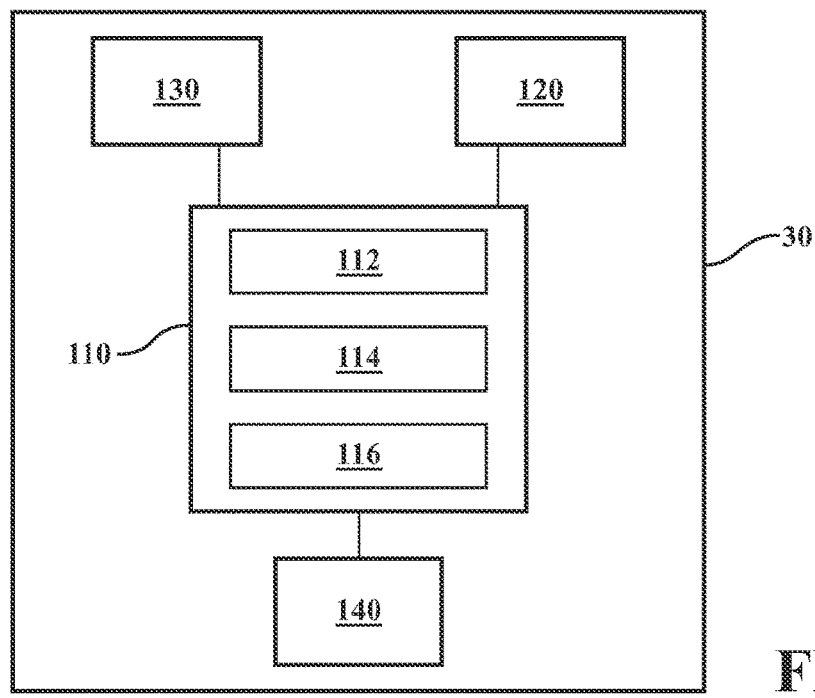
FIG. 3 schematically illustrates the computerized prognostics controller, in accordance with the present disclosure.

FIG. 3 schematically illustrates the computerized prognostics controller 30. Computerized prognostics controller 30 includes processing device 110, communications device 120, data input output device 130, and memory storage device 140. It is noted that computerized prognostics controller 30 may include other components and some of the components are not present in some embodiments.

The processing device 110 may include memory, e.g., read only memory (ROM) and random-access memory (RAM), storing processor-executable instructions and one or more processors that execute the processor-executable instructions. In embodiments where the processing device 110 includes two or more processors, the processors may operate in a parallel or distributed manner. Processing device 110 may execute the operating system of the computerized prognostics controller 30. Processing device 110 may include one or more modules executing programmed code or computerized processes or methods including executable steps. Illustrated modules may include a single physical device or functionality spanning multiple physical devices. In the illustrative embodiment, the processing device 110 also includes a battery cell data collection module 112, a data analysis and prognostics module 114, and an alert/reaction module 116, which are described in greater detail below.

The data input output device 130 is a device that is operable to take data gathered from sensors and devices throughout the vehicle and process the data into formats readily usable by processing device 110. Data input output device 130 is further operable to process output from processing device 110 and enable use of that output by other devices or control modules throughout the vehicle.

The communications device 120 may include a communications/data connection with a bus device configured to transfer data to different components of the system and may include one or more wireless transceivers for performing wireless communication.

The memory storage device 140 is a device that stores data generated or received by the computerized prognostics controller 30. The memory storage device 140 may include, and is not limited to, a hard disc drive, an optical disc drive, and/or a flash memory drive.

The battery cell data collection module 112 may collect data from a plurality of voltage sensors to determine or estimate open-circuit voltages for a plurality of battery cells. The battery cell data collection module 112 may store and catalog data for a current time period and may additionally include stored data related to historical operation of the plurality of battery cells.

The data analysis and prognostics module 114 receives data from the battery cell data collection module 112. The data analysis and prognostics module 114 may utilize one or more prognostic algorithm to analyze the data to determine whether any of the battery cells may be identified as having an internal short circuit. The data analysis and prognostics module 114 may include any one of the four exemplary prognostic algorithms provided herein. The data analysis and prognostics module 114 may include two or three of the exemplary prognostics algorithms provided herein and may include one or more alternative prognostic algorithms. The data analysis and prognostics module 114 may operate one prognostics algorithm at a time. The data analysis and prognostics module 114 may select one of a plurality of available algorithms based upon monitored factors. The data analysis and prognostics module 114 may operate multiple prognostic algorithms simultaneously and may selectively utilize or may average results of the various algorithms. The data analysis and prognostics module 114 may compare results of the algorithm or algorithms to a threshold to determine whether any of the monitored battery cells are likely to include an internal short circuit.

The alert/reaction module 116 may receive data or an indication from the data analysis and prognostics module 114 and may take action based upon an indication that one of the battery cells includes an internal short circuit. The alert/reaction module 116 may generate an audible or visible alert to an operator of the vehicle. The alert/reaction module 116 may utilize a communications network to alert an owner or operator of the vehicle that a battery cell has an internal short circuit through a portable cellular device. The alert/reaction module 116 may command an immediate or an urgent shut-down of the vehicle, for example, instructing an operator of the vehicle to find a stopping point within a time period. The alert/reaction module 116 may utilize a communications network to alert local first responders or a remove server operated by a service provider as to a vehicle with a battery including an internal short. The alert/reaction module 116 may additionally include programming to provide customer relationship management (CRM) support, for example, providing a connection between a vehicle user or owner and an automated or human individual providing information about the sensed/determined condition in the vehicle. The alert/reaction module 116 may further include automatic control programming to take physical control over the vehicle or a portion of the vehicle, for example, reducing a maximum power output of the vehicle, isolating the problematic battery cell, etc.

Computerized prognostics controller 30 is provided as an exemplary computerized device capable of executing programmed code to accomplish the methods and processes described herein. A number of different embodiments of computerized prognostics controller 30, devices attached thereto, and modules operable therein are envisioned, and the disclosure is not intended to be limited to examples provided herein.

Figure 4:
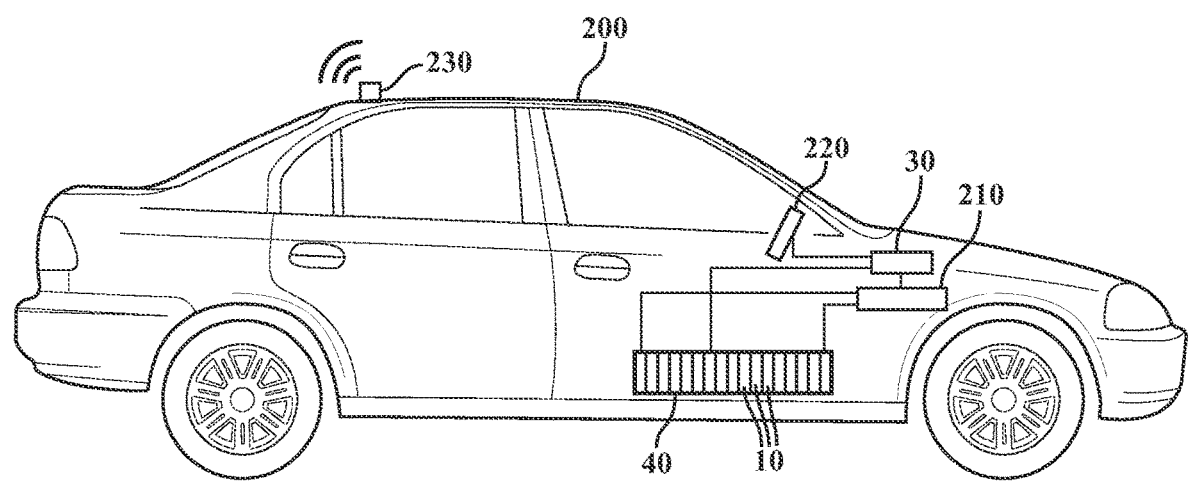
FIG. 4 schematically illustrates an exemplary vehicle including the system for self-discharge prognostics, in accordance with the present disclosure.

FIG. 4 schematically illustrates an exemplary vehicle 200 including the system for self-discharge prognostics 5 of FIG. 1. The battery pack 40 is illustrated including a plurality of battery cells 10. The battery cells 10 may be connected in series, in parallel, or selectively connectible to deliver a desired voltage for use by the vehicle 200. The battery pack 40 is connected to vehicle propulsion system 210, which includes one or more electric machines operable to provide motive force to the vehicle 200. The computerized prognostics controller 30 is electronically connected to the battery pack 40 and one or more voltage sensors operable to provide open-circuit voltages for each of the battery cells 10. The computerized prognostics controller 30 is further electronically connected to a human interface device 220 operable to provide alerts and/or information to an operator of the vehicle. The computerized prognostics controller 30 is further electronically connected to a wireless communications system 230, which may provide information to and receive instruction from a cellular device, a remote server device, and/or communications devices operated by first responders. The vehicle 200 is exemplary and may contain alternative and additional components.

Figure 5:
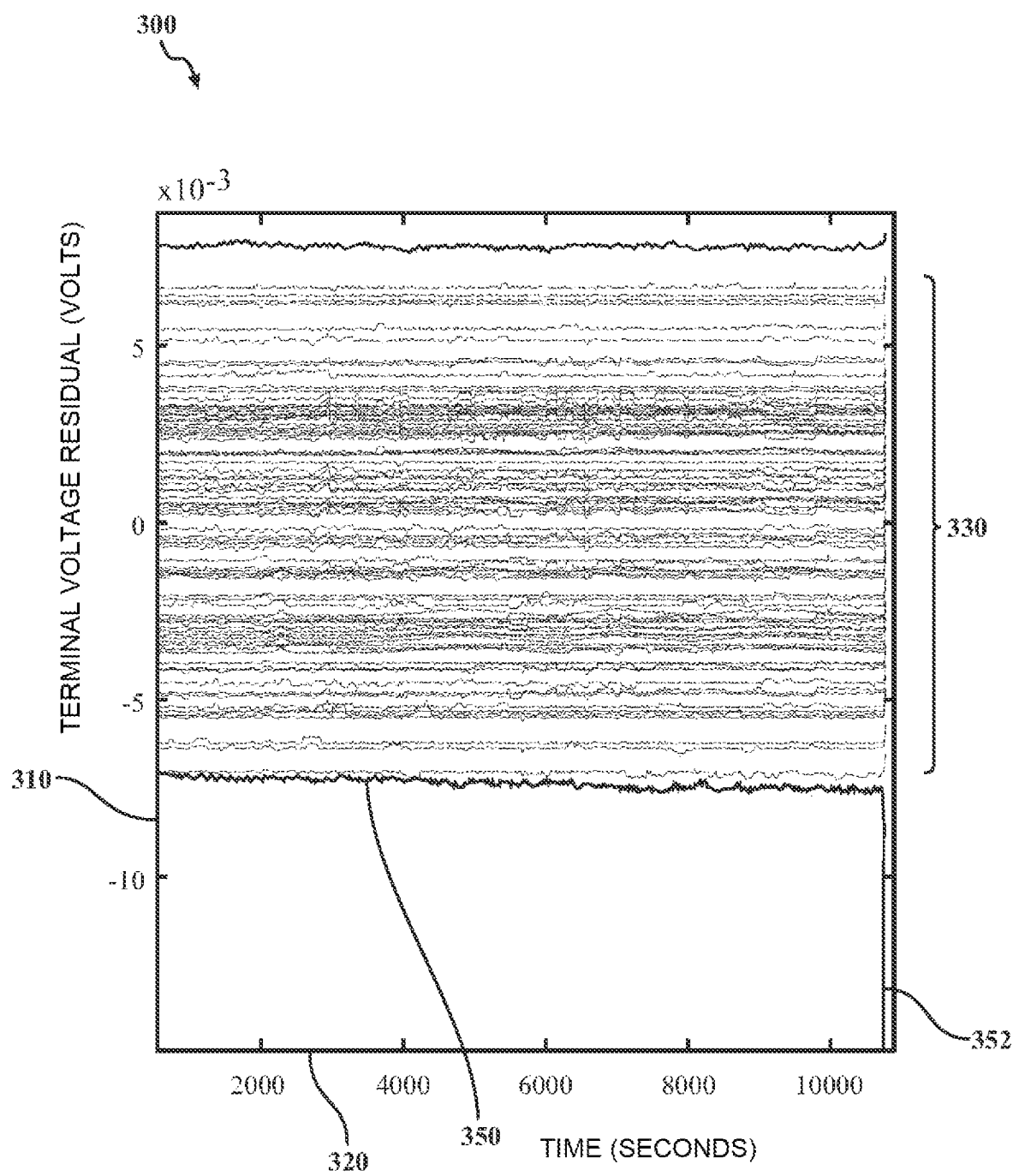
FIG. 5 graphically illustrates test results, plotting upon a vertical axis terminal voltage for each of a plurality of battery cells versus time upon a horizontal axis, in accordance with the present disclosure.

FIG. 5 graphically illustrates test results, with graph 300 plotting upon a vertical axis 310 terminal voltage residual in Volts for each of a plurality of battery cells versus time in seconds upon a horizontal axis 320. The graph 300 includes plots 330 illustrating open-circuit voltage residuals for a plurality of battery cells through a time period. The open-circuit voltage residuals in plots 330 include noise, causing the plots to be wavy, while the plots 330 each remain essentially constant or with a constant average value. The plots 330 reflect open-circuit voltages for normally operating battery cells without an internal short circuit. Plot 350 illustrates an open-circuit voltage for a battery cell with an internal short circuit. The open-circuit voltage of plot 350 goes down slowly over time. In time, portion 352 of plot 350 illustrates complete failure of the battery cell represented by plot 350.

Figure 6:
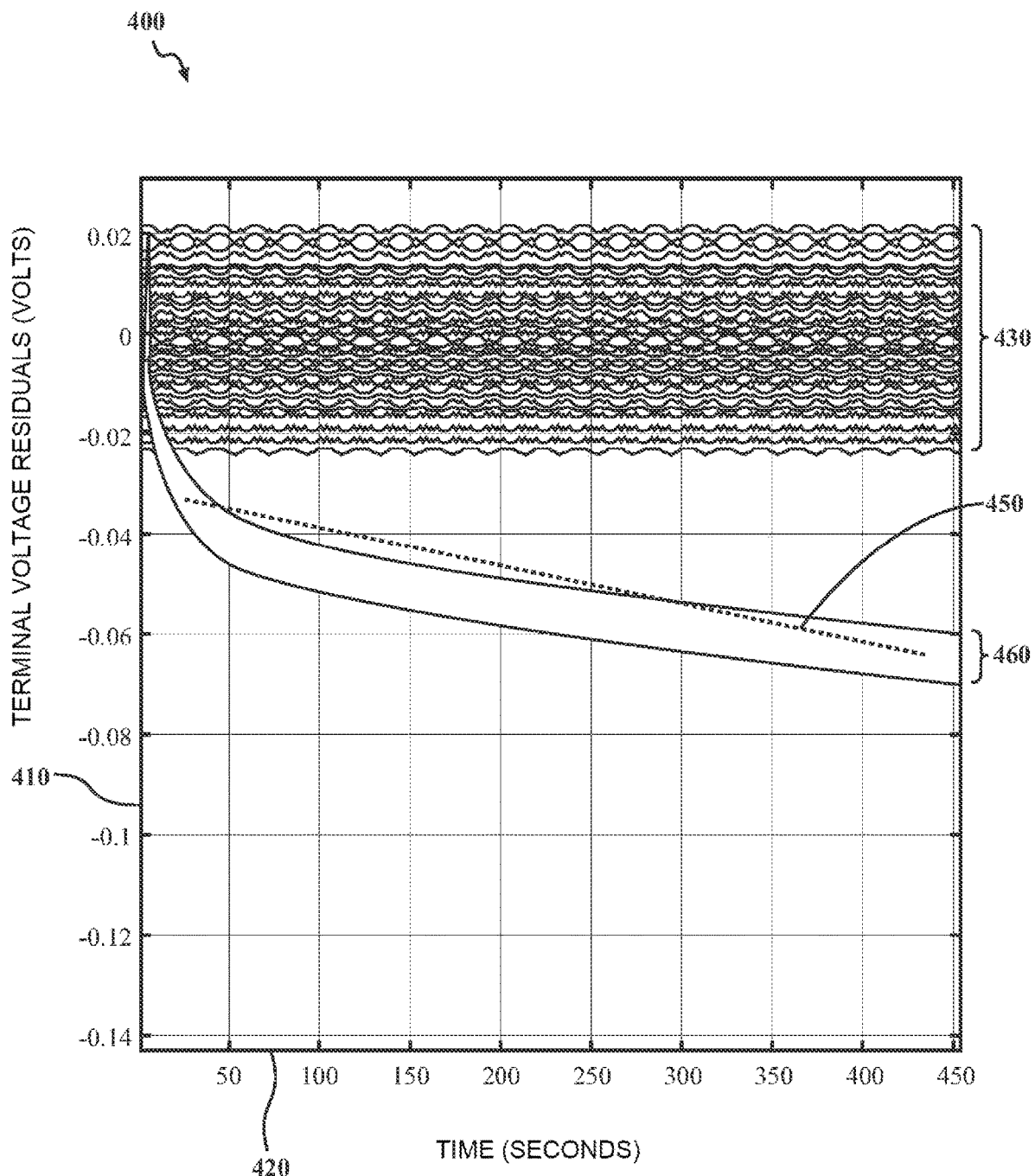
FIG. 6 graphically illustrates additional test results, plotting upon a vertical axis terminal voltage for each of a plurality of battery cells versus time upon a horizontal axis, in accordance with the present disclosure.

FIG. 6 graphically illustrates additional test results, with graph 400 plotting upon a vertical axis 410 terminal voltage residuals for each of a plurality of battery cells versus time upon a horizontal axis 420. The graph 400 includes plots 430 illustrating normal open-circuit voltage residuals for a plurality of battery cells through a time period. Plot 450 illustrates values measured for a battery cell with an internal short circuit. It is understood that more rapid drops in voltage correspond to lower internal resistance within the battery cell. According to a first exemplary method described herein to prognose an internal short circuit, a first order polynomial regression may be applied to the data of plot 450 to generate a polyfit line band 460. A slope and intercept value for the polyfit line band 460 may be utilized to prognose the internal short circuit of the battery cell represented by plot 450. The intercept value may be a point at which the polyfit line band 460 intercepts the vertical axis 410 or some other defined vertical line upon the graph 400. The slope value for the polyfit line band 460 may be defined as a ratio of a change in vertical value divided by a change in horizontal value. A greater negative slope or a more vertical slope for a polyfit line indicates that the open-circuit voltage and a corresponding SOC for a particular battery cell is decreasing faster than battery cells with milder or more horizontal polyfit line slopes.

Figure 7:
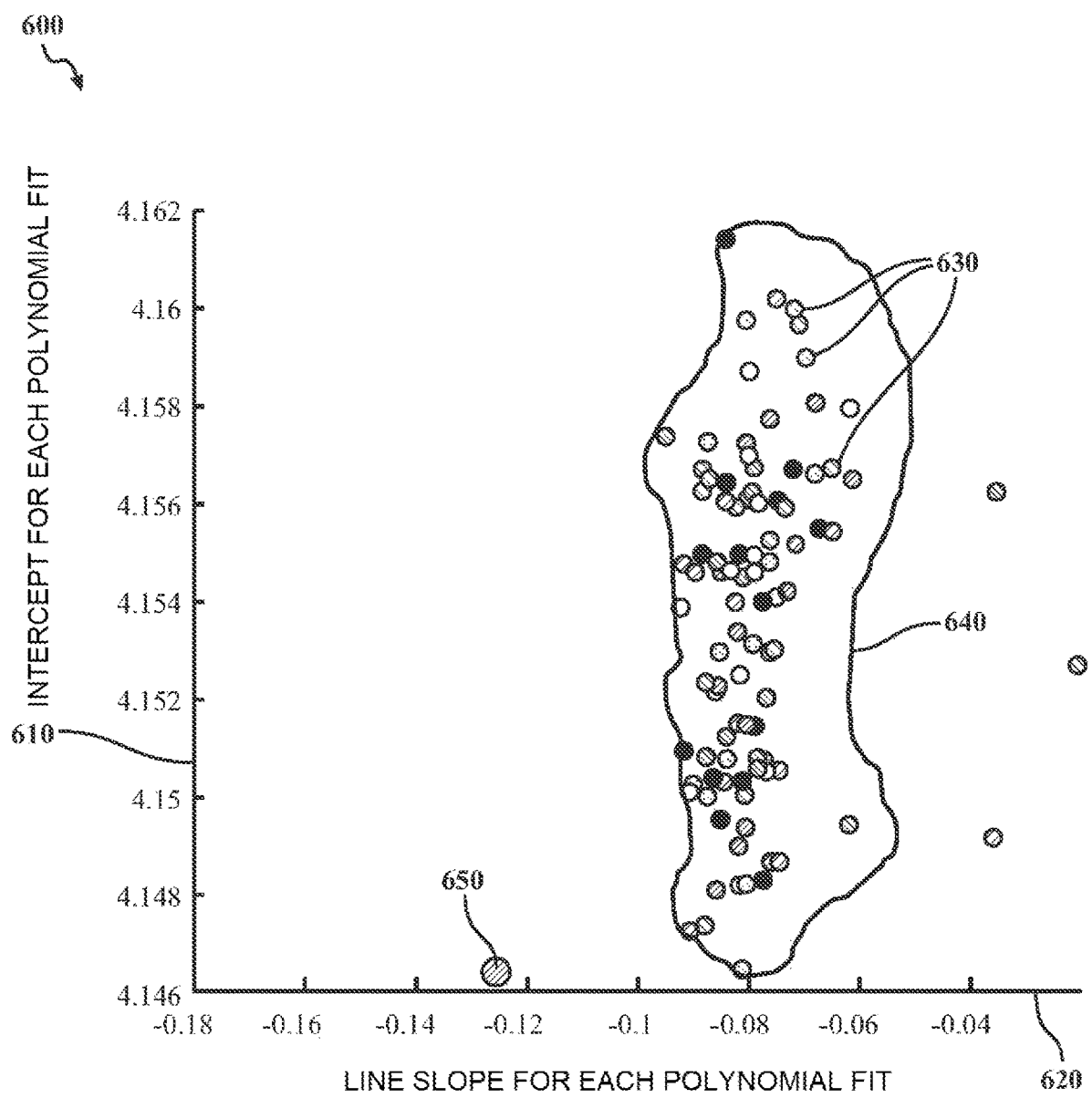
FIG. 7 graphically illustrates polynomial fits determined based upon data from each of the plurality of battery cells illustrated upon FIG. 6, plotting upon a vertical axis vertical axis intercepts for each of the polynomial fits versus line slopes for each of the polynomial fits on the horizontal axis, in accordance with the present disclosure.

FIG. 7 graphically illustrates polynomial fits (using either linear regression or recursive least square estimation) determined based upon data from each of the plurality of battery cells illustrated upon FIG. 5, with graph 600 plotting upon a vertical axis 610 intercepts for each of the polynomial fits versus line slopes for each of the polynomial fits on the horizontal axis 620. FIG. 7 illustrates one exemplary method to sort polyfit line representations to identify data representing a battery cell with an internal short circuit. Other similar methods are envisioned. In the method illustrated in FIG. 7, for each plot 330 and for plot 350 of FIG. 5, a polyfit line is defined. Slope and intercept values for each of the plots 330 and for plot 350 are represented upon the graph 600 as data points 630 and data point 650, respectively. The data points 630 each include similar slope values, which lead to horizontal axis values of data points 630 being clustered around a common horizontal axis value, indicating that the slopes of the polyfit lines for plots 330 indicate constant or near constant open-circuit voltages. Data point 650 is located at a distinctly different horizontal axis value, indicating that plot 350 and the polyfit line determined therefor have a significantly greater negative slope than do the polyfit lines for plots 330. As a greater negative slope represents a battery rapidly losing an open-circuit voltage and a corresponding SOC, data point 650 having a distinctly different horizontal axis value than the horizontal axis values for data points 630, indicates a problematic voltage drop in the battery cell corresponding to the plot 350 in FIG. 5. This distinct negative slope for this abnormal battery cell is detected around 8000 seconds in FIG. 5, therefore, can generate a warning 40 minutes before a complete battery cell failure that happens at about 12000 seconds in the test data illustrated in FIG. 5. This gives additional useful time for earlier actions for failure mitigation A number of methods may be utilized to sort or evaluate slope values and corresponding data points upon the graph 600. In one embodiment, a machine learning algorithm may be utilized to define a boundary 640 within which data points 630 corresponding to normally operating battery cells exist. Such a machine learning algorithm may be trained with sample battery cells known to be operating normally or with values selected to correspond to battery cells operating normally. Values falling outside of the boundary 640 may indicate, as disclosed in relation to data point 650, a battery cell including an internal short circuit. In another embodiment, slope values determined by polyfit lines corresponding to open-circuit voltage values changing over time may be compared to a threshold slope value. A battery cell including an internal short circuit may be prognosed when the negative slope value of a polyfit line exceeds a threshold negative slope value.

Figure 8:
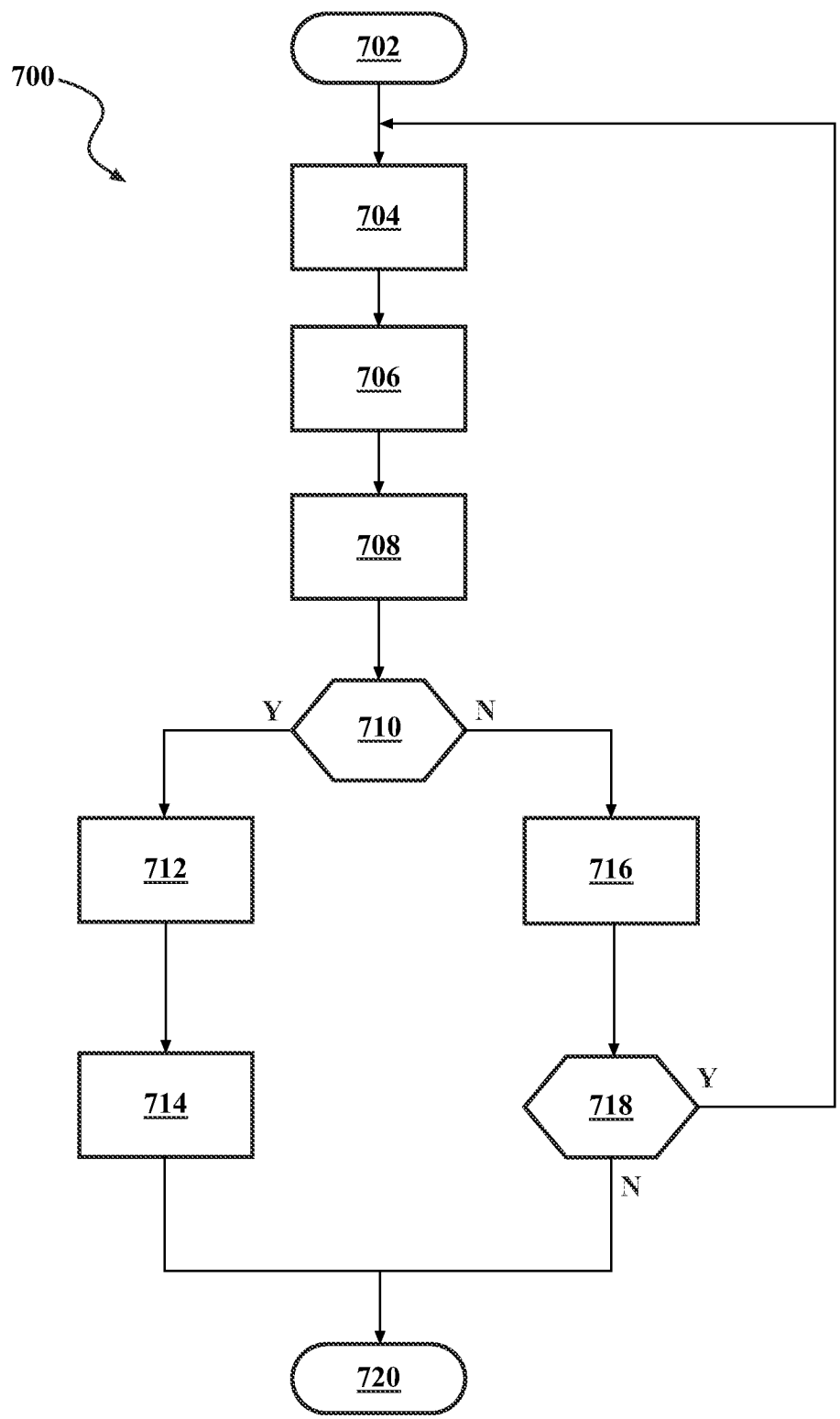
FIG. 8 is a flowchart illustrating a method for self-discharge prognostics for vehicle battery cells with an internal short circuit, in accordance with the present disclosure.

FIG. 8 is a flowchart illustrating a method 700 for self-discharge prognostics for vehicle battery cells with an internal short circuit. The method 700 starts at step 702. At step 704, an open-circuit voltage or voltage residual of each of a plurality a battery cells are monitored over a time period. At step 706, a prognostics algorithm is utilized to analyze the open-circuit voltage values or state of charge for each of the plurality of battery cells. At step 708, an output of the prognostics algorithm is utilized to determine whether any of the battery cells includes an internal closed circuit, for example, by comparing a slope value corresponding to the open-circuit voltage change over time to acceptable slope values or a threshold slope value. At step 710, if one of the battery cells is determined to include an internal short circuit, the method 700 proceeds to step 712, where an alert is generated, for example, to an operator of the vehicle and/or to a remote monitoring service operating a remote server device. At step 714, remedial action may be taken, such as requiring the vehicle to be promptly parked or a block may be put upon starting the vehicle. At step 710, if the battery cells are not determined to include an internal short circuit, the method 700 proceeds to step 716 where normal operation of the vehicle is maintained. At step 718, a determination is made whether the method 700 is to continue operation. If the method 700 is to continue, the method 700 returns to step 704, where additional open-circuit voltages of each of the plurality of battery cells are monitored, and the method repeats. If the method 700 is not to continue, the method proceeds to step 720 where the method ends. Alternative or additional method steps are envisioned, and the disclosure is not intended to be limited to the exemplary method steps provided herein.

While the best modes for carrying out the disclosure have been described in detail, those familiar with the art to which this disclosure relates will recognize various alternative designs and embodiments for practicing the disclosure within the scope of the appended claims.

What is claimed is:

1. A system for self-discharge prognostics for vehicle battery cells of a vehicle with an internal short circuit, comprising:
   a battery pack including a plurality of battery cells;
   for each of the plurality of battery cells, a voltage sensor iteratively measuring open-circuit voltage data through a test period, wherein the open-circuit voltage data is collected at instances where the battery cell is in an open-circuit condition; and
   a computerized prognostic controller, operating programming to:
      monitor the open-circuit voltage data for each of the plurality of battery cells;
      evaluate a voltage drop rate through a time window for each of the plurality of battery cells based upon the open-circuit voltage data;
      identify one of the plurality of battery cells to include the internal short circuit based upon the voltage drop rate; and
      signal an alert based upon the one of the plurality of battery cells including the internal short circuit; and
   wherein evaluating the voltage drop rate for each of the plurality of battery cells includes iteratively applying linear regression at progressively extended time window lengths to estimate a line describing voltage drop per unit time for each of the plurality of battery cells;
   wherein identifying the one of the plurality of battery cells to include the internal short circuit includes analyzing a slope of the line describing voltage drop per unit time for each of the plurality of battery cells;
   wherein analyzing the slope of the line describing voltage drop per unit time includes comparing the slope of the line describing voltage drop per unit time corresponding to a first cell of the plurality of battery cells through the test period to each of the respective slopes of the lines describing voltage drop per unit time corresponding to each of the plurality of battery cells that are not the first cell through the test period;
   wherein the test period is a common test period for the plurality of battery cells, starting at a first instant in time and ending at a second instant in time; and wherein each of the plurality of battery cells of the battery pack is exposed to common conditions that exist within the battery pack through the test period.

2. The system of claim 1, wherein signaling the alert includes providing a warning to an operator of the vehicle.

3. The system of claim 1, wherein signaling the alert includes providing a warning to a remote server device through a wireless communications network.

4. A system for self-discharge prognostics for vehicle battery cells of a vehicle with an internal short circuit, comprising:
  a battery pack including a plurality of battery cells;
  for each of the plurality of battery cells, a voltage sensor iteratively measuring open-circuit voltage data through a test period, wherein the open-circuit voltage data is collected at instances where the battery cell is in an open-circuit condition; and
  a computerized prognostic controller, operating programming to:
    monitor the open-circuit voltage data for each of the plurality of battery cells;
    evaluate a voltage drop rate through a time window for each of the plurality of battery cells based upon the open-circuit voltage data;
    identify one of the plurality of battery cells to include the internal short circuit based upon the voltage drop rate; and
    signal an alert based upon the one of the plurality of battery cells including the internal short circuit; and
  wherein evaluating the voltage drop rate for each of the plurality of battery cells includes iteratively applying a recursive least square algorithm to estimate a line slope parameter describing voltage drop per unit time over a progressively extended time window for each of the plurality of battery cells; and
  wherein identifying the one of the plurality of battery cells to include the internal short circuit includes analyzing the line slope parameter describing voltage drop per unit time for each of the plurality of battery cells;
  wherein analyzing the line slope parameter describing voltage drop per unit time includes comparing the line slope parameter describing voltage drop per unit time corresponding to a first cell of the plurality of battery cells through the test period to each of the respective line slope parameters describing voltage drop per unit time corresponding to each of the plurality of battery cells that are not the first cell through the test period;
  wherein the test period is a common test period for the plurality of battery cells, starting at a first instant in time and ending at a second instant in time; and
  wherein each of the plurality of battery cells of the battery pack is exposed to common conditions that exist within the battery pack through the test period.

5. The system of claim 4, wherein signaling the alert includes providing a warning to an operator of the vehicle.

6. The system of claim 4, wherein signaling the alert includes providing a warning to a remote server device through a wireless communications network.

7. A system for self-discharge prognostics for vehicle battery cells of a vehicle with an internal short circuit, comprising:
  a battery pack including a plurality of battery cells;
  for each of the plurality of battery cells, a voltage sensor iteratively measuring open-circuit voltage data through a test period, wherein the open-circuit voltage data is collected at instances where the battery cell is in an open-circuit condition; and
  a computerized prognostic controller, operating programming to:
    monitor the open-circuit voltage data for each of the plurality of battery cells;
    evaluate a voltage drop rate through a time window for each of the plurality of battery cells based upon the open-circuit voltage data;
    identify one of the plurality of battery cells to include the internal short circuit based upon the voltage drop rate; and
    signal an alert based upon the one of the plurality of battery cells including the internal short circuit; and
  wherein evaluating the voltage drop rate for each of the plurality of battery cells includes applying a Kalman filter to estimate slope and intercept parameters of a line describing voltage drop per unit time for each of the plurality of battery cells;
  wherein identifying the one of the plurality of battery cells to include the internal short circuit includes analyzing the slope and intercept parameters of the line describing voltage drop per unit time for each of the plurality of battery cells;
  wherein analyzing the slope and intercept parameters of the line describing voltage drop per unit time includes comparing the slope and intercept parameters of the line describing voltage drop per unit time corresponding to a first cell of the plurality of battery cells through the test period to each of the respective slope and intercept parameters of the lines describing voltage drop per unit time corresponding to each of the plurality of battery cells that are not the first cell through the test period;
  wherein the test period is a common test period for the plurality of battery cells, starting at a first instant in time and ending at a second instant in time; and
  wherein each of the plurality of battery cells of the battery pack is exposed to common conditions that exist within the battery pack through the test period.

8. The system of claim 7, wherein signaling the alert includes providing a warning to an operator of the vehicle.

9. The system of claim 7, wherein signaling the alert includes providing a warning to a remote server device through a wireless communications network.

\* \* \* \* \*